United States Patent
Allore et al.

(10) Patent No.: US 9,622,365 B2
(45) Date of Patent: Apr. 11, 2017

(54) APPARATUS AND METHODS FOR ACCOMMODATING A DISPLAY IN AN ELECTRONIC DEVICE

(71) Applicant: Google Technology Holdings LLC, Mountain View, CA (US)

(72) Inventors: Joseph L. Allore, Mundelein, IL (US); David G. Fliszar, Gurnee, IL (US); Jason P. Wojack, Libertyville, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 96 days.

(21) Appl. No.: 13/893,533

(22) Filed: May 14, 2013

(65) Prior Publication Data
US 2014/0240903 A1    Aug. 28, 2014

Related U.S. Application Data

(60) Provisional application No. 61/768,645, filed on Feb. 25, 2013.

(51) Int. Cl.
| | |
|---|---|
| *G06F 3/01* | (2006.01) |
| *H05K 5/06* | (2006.01) |
| *G06F 1/16* | (2006.01) |
| *H04M 1/02* | (2006.01) |

(52) U.S. Cl.
CPC .............. *H05K 5/06* (2013.01); *G06F 1/1626* (2013.01); *G06F 1/1643* (2013.01); *G06F 1/1656* (2013.01); *H04M 1/0266* (2013.01)

(58) Field of Classification Search
CPC .................................. H05K 5/06; G06F 3/016
See application file for complete search history.

(56) References Cited

U.S. PATENT DOCUMENTS

| | | | |
|---|---|---|---|
| 4,985,878 A | 1/1991 | Yamada et al. | |
| 5,416,730 A | 5/1995 | Lookofsky | |
| 5,479,285 A | 12/1995 | Burke | |
| (Continued) | | | |

FOREIGN PATENT DOCUMENTS

| | | |
|---|---|---|
| DE | 102009003128 | 11/2010 |
| EP | 1225751 | 7/2002 |
| (Continued) | | |

OTHER PUBLICATIONS

Patent Cooperation Treaty, International Search Report and Written Opinion of the International Searching Authority for International Application No. PCT/US2014/012739, May 9, 2014, 11 pages.

(Continued)

*Primary Examiner* — Paisley L Arendt
*Assistant Examiner* — Edmond Lau
(74) *Attorney, Agent, or Firm* — Wolfe-SBMC

(57) ABSTRACT

An electronic device (100) includes a housing member (103) and a display layer (512). The display includes two substrate layers (404,405) sealed together at a seam (408) disposed along a periphery (602) of each substrate layer. A compression gasket (604) is disposed between the housing member and the display, the compression gasket being disposed against the display interior to the seam. A second compression gasket (995) can be disposed interior to the compression gasket to provide a dampening function.

20 Claims, 12 Drawing Sheets

(56) References Cited

U.S. PATENT DOCUMENTS

| | | |
|---|---|---|
| 5,625,697 A | 4/1997 | Bowen et al. |
| 5,872,744 A | 2/1999 | Taylor |
| 5,889,737 A | 3/1999 | Alameh et al. |
| 6,158,884 A | 12/2000 | Lebby et al. |
| 6,382,448 B1 | 5/2002 | Yuhara et al. |
| 6,528,203 B1 | 3/2003 | Mitamura |
| 6,532,152 B1 | 3/2003 | White et al. |
| 6,771,237 B1 | 8/2004 | Kalt |
| 7,224,963 B2 | 5/2007 | Anderson et al. |
| 7,259,155 B2 | 8/2007 | Sakai et al. |
| 7,401,758 B2 | 7/2008 | Liang et al. |
| 7,623,780 B2 | 11/2009 | Takita |
| 7,766,517 B2 | 8/2010 | Kerr et al. |
| 7,953,463 B2 | 5/2011 | Misawa |
| 8,207,936 B2 | 6/2012 | Gustafsson et al. |
| 8,359,020 B2 | 1/2013 | Lebeau et al. |
| 8,456,586 B2 | 6/2013 | Mathew et al. |
| 8,517,896 B2 | 8/2013 | Robinette et al. |
| 8,675,124 B2 | 3/2014 | Kawakami |
| 9,009,984 B2 | 4/2015 | Caskey et al. |
| 9,201,454 B2 | 12/2015 | Haupt et al. |
| 9,484,001 B2 | 11/2016 | Dabhi |
| 2002/0103014 A1 | 8/2002 | Hutchison et al. |
| 2003/0158593 A1 | 8/2003 | Heilman et al. |
| 2004/0056845 A1 | 3/2004 | Harkcom et al. |
| 2004/0250933 A1 | 12/2004 | DeMichele |
| 2005/0285811 A1 | 12/2005 | Kawase et al. |
| 2007/0103908 A1* | 5/2007 | Tabito et al. .................. 362/294 |
| 2007/0273609 A1 | 11/2007 | Yamaguchi et al. |
| 2008/0001971 A1 | 1/2008 | Kouninski |
| 2008/0074551 A1 | 3/2008 | Kawakami |
| 2008/0094515 A1 | 4/2008 | Gutta et al. |
| 2008/0204367 A1 | 8/2008 | Lafarre et al. |
| 2008/0285290 A1* | 11/2008 | Ohashi et al. .................. 362/373 |
| 2008/0291225 A1 | 11/2008 | Arneson |
| 2008/0303782 A1 | 12/2008 | Grant et al. |
| 2008/0309589 A1 | 12/2008 | Morales |
| 2008/0309861 A1* | 12/2008 | Seki et al. ..................... 349/117 |
| 2009/0195959 A1 | 8/2009 | Ladouceur et al. |
| 2009/0254869 A1 | 10/2009 | Ludwig et al. |
| 2010/0053174 A1 | 3/2010 | Cohen et al. |
| 2010/0056223 A1 | 3/2010 | Choi et al. |
| 2010/0225600 A1* | 9/2010 | Dai et al. ........................ 345/173 |
| 2010/0231692 A1 | 9/2010 | Perlman et al. |
| 2010/0238367 A1 | 9/2010 | Montgomery et al. |
| 2010/0265431 A1* | 10/2010 | Li ................................. 349/59 |
| 2010/0328571 A1 | 12/2010 | Itaya |
| 2011/0109538 A1 | 5/2011 | Kerr et al. |
| 2011/0221656 A1 | 9/2011 | Haddick et al. |
| 2011/0242750 A1 | 10/2011 | Oakley |
| 2011/0255303 A1 | 10/2011 | Nichol et al. |
| 2012/0038613 A1 | 2/2012 | Choi |
| 2012/0044131 A1 | 2/2012 | Nussbacher et al. |
| 2012/0055553 A1* | 3/2012 | Logunov et al. ............. 136/263 |
| 2012/0091923 A1 | 4/2012 | Kastner-Jung et al. |
| 2012/0112994 A1 | 5/2012 | Vertegaal et al. |
| 2012/0177953 A1 | 7/2012 | Bhardwaj et al. |
| 2012/0242592 A1 | 9/2012 | Rothkopf et al. |
| 2013/0053661 A1 | 2/2013 | Alberth et al. |
| 2013/0076649 A1 | 3/2013 | Myers et al. |
| 2013/0127733 A1 | 5/2013 | Krishnaswamy |
| 2013/0278631 A1 | 10/2013 | Border et al. |
| 2013/0307419 A1 | 11/2013 | Simonian et al. |
| 2013/0329460 A1 | 12/2013 | Mathew et al. |
| 2014/0063049 A1 | 3/2014 | Armstrong-Muntner |
| 2014/0063055 A1 | 3/2014 | Osterhout et al. |
| 2014/0265821 A1 | 9/2014 | Malon et al. |
| 2014/0285967 A1 | 9/2014 | Wikander et al. |
| 2014/0368981 A1 | 12/2014 | Haupt et al. |
| 2014/0372940 A1 | 12/2014 | Cauwels et al. |
| 2015/0138505 A1 | 5/2015 | Grenon et al. |
| 2015/0179141 A1 | 6/2015 | Dabhi |

FOREIGN PATENT DOCUMENTS

| | | |
|---|---|---|
| EP | 2500898 | 9/2012 |
| GB | 2327012 | 1/1999 |
| WO | WO-9624093 | 8/1996 |
| WO | WO-0025193 | 5/2000 |
| WO | WO-2008057143 | 5/2008 |
| WO | 2011121403 A1 | 10/2011 |

OTHER PUBLICATIONS

"Final Office Action", U.S. Appl. No. 13/455,921, Jun. 13, 2014, 18 pages.

"Final Office Action", U.S. Appl. No. 13/455,921, Oct. 7, 2015, 19 pages.

"Final Office Action", U.S. Appl. No. 14/139,485, Oct. 16, 2015, 11 pages.

"International Preliminary Report on Patentability", Application No. PCT/US2013/034760, Nov. 6, 2014, 10 pages.

"International Search Report and Written Opinion", Application No. PCT/US2013/034760, Jun. 28, 2013, 13 pages.

"International Search Report and Written Opinion", Application No. PCT/US2012/064300, Apr. 11, 2013, 14 pages.

"International Search Report and Written Opinion", Application No. PCT/US2014/017331, Sep. 1, 2014, 15 pages.

"Non-Final Office Action", U.S. Appl. No. 13/297,662, Jun. 2, 2014, 12 pages.

"Non-Final Office Action", U.S. Appl. No. 13/455,921, Feb. 24, 2015, 17 pages.

"Non-Final Office Action", U.S. Appl. No. 13/455,921, Dec. 18, 2013, 15 pages.

"Non-Final Office Action", U.S. Appl. No. 14/139,485, Mar. 10, 2016, 11 pages.

"Non-Final Office Action", U.S. Appl. No. 14/139,485, May 26, 2015, 10 pages.

"Non-Final Office Action", U.S. Appl. No. 14/474,808, Jan. 12, 2016, 9 pages.

"Notice of Allowance", U.S. Appl. No. 14/082,733, Feb. 18, 2015, 7 pages.

"Notice of Allowance", U.S. Appl. No. 14/082,733, Jul. 27, 2015, 7 pages.

"Restriction Requirement", U.S. Appl. No. 13/297,662, Nov. 14, 2013, 5 pages.

"Restriction Requirement", U.S. Appl. No. 14/034,860, Sep. 4, 2015, 11 pages.

Kee,"Bendable batteries in the pipeline?", Ubergizmo, http://www.ubergizmo.com/2011/02/bendable-batteries-in-the-pipeline/, Feb. 28, 2011, 2 pages.

Tan,"Exploiting the Cognitive and Social Benefits of Physically Large Displays", Carnegie Mellon University CMU-CS-04-154, Aug. 2004, 201 pages.

"Final Office Action", U.S. Appl. No. 14/034,860, Jun. 27, 2016, 10 pages.

"Final Office Action", U.S. Appl. No. 14/474,808, Jun. 2, 2016, 15 pages.

"Final Office Action", U.S. Appl. No. 14/139,485, Jul. 7, 2016, 5 pages.

"Advisory Action", U.S. Appl. No. 14/474,808, Sep. 19, 2016, 2 pages.

* cited by examiner

APPARATUS AND METHODS FOR ACCOMMODATING A DISPLAY IN AN ELECTRONIC DEVICE

BACKGROUND

Technical Field

This disclosure relates generally to electronic devices, and more particularly to electronic devices having displays.

Background Art

"Intelligent" portable electronic devices, such as smart phones, tablet computers, and the like, are becoming increasingly powerful computational tools. Moreover, these devices are becoming more prevalent in today's society. For example, not too long ago a mobile telephone was a simplistic device with a twelve-key keypad that only made telephone calls. Today, "smart" phones, tablet computers, personal digital assistants, and other portable electronic devices not only make telephone calls, but also manage address books, maintain calendars, play music and videos, display pictures, and surf the web.

As the capabilities of these electronic devices have progressed, so too have their user interfaces. Prior keypads having a limited number of keys have given way to sophisticated user input devices such as touch sensitive screens or touch sensitive pads. Touch sensitive displays include sensors for detecting the presence of an object such as a finger or stylus. By placing the object on the touch sensitive surface, the user can manipulate and control the electronic device without the need for a physical keypad.

One drawback to touch sensitive electronic devices is that the displays are prone to damage. If a display becomes damaged, perhaps due to drop impact, the device can be rendered unusable. It would be advantageous to have an electronic device with a display that is less prone to damage.

Figure 1:
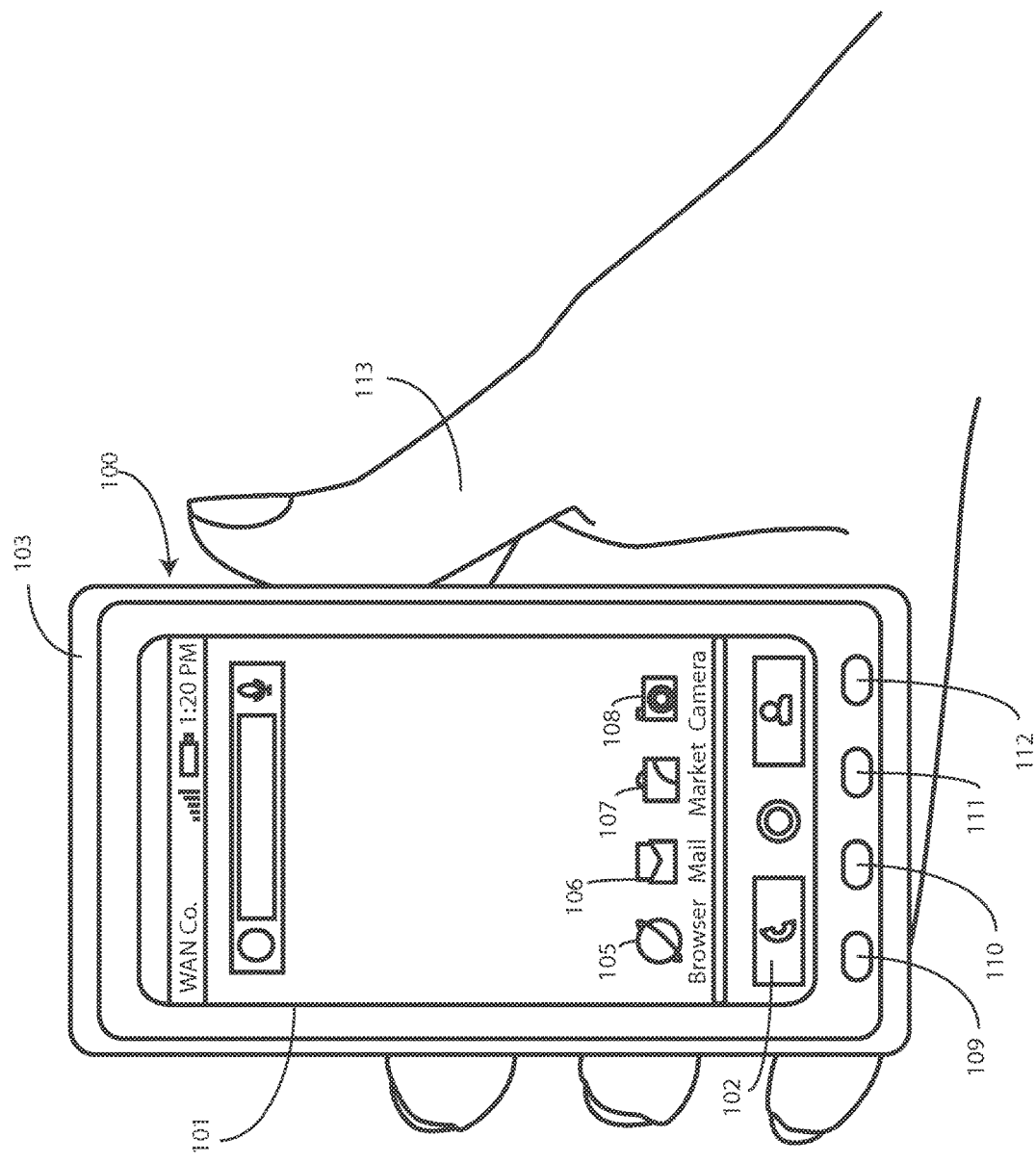
FIGS. 1 and 2 illustrate an explanatory electronic device configured in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

Embodiments of the present disclosure provide one or more apparatuses and methods that reduce cleavage modes occurring in displays of electronic devices. Using an organic light emitting diode display as an example, these displays are formed by fusing two glass substrates together with a fused weld known as a "frit." A frit is a ceramic composition that is thermally fused between layers of glass to form a seam or seal between those two substrates. Experimental testing has shown the frit forming the seam is very brittle. Moreover, testing has shown that the fit forming the seam fractures easily allowing the glass substrates to separate in a cleavage mode. The organic film sealed between the glass substrates and the frit then leaks out, rendering the display inoperable. Testing has shown that this cleavage mode failure is one of the most common failure modes—if not the predominant failure mode—in displays.

Embodiments of the present disclosure work to prevent cleavage mode failure by providing a compression gasket that is either disposed against a surface of the display interior to the frit forming the seam, or alternatively, disposed against the surface of the display beneath the fit forming the seam and extending interior to the frit. By applying compression force against the display interior to the frit forming the seam to preload the display against one of the housing members of the device, the compression gasket serves as a clamping member interior to the frit to prevent cleavage failures. This is in contrast to prior art designs where mechanical constraints are disposed exterior to the frit. Accordingly, embodiments of the disclosure greatly reduces device failure due to cleavage modes when compared to prior art designs.

In one embodiment, an electronic device includes a housing member, a display, and a compression gasket. In one embodiment, the display includes two substrate layers sealed together at a seam disposed along a periphery of each substrate layer. In one embodiment the display comprises an organic light emitting diode display in which the substrate layers and the seam seal an organic film therebetween. In one embodiment, the seam is formed by fusing frit between the substrate layers. The compression gasket, in one embodiment, is disposed between the housing member and the display against the display interior to the seam. In another embodiment, the compression gasket is disposed beneath the seam. However, in this latter embodiment the compression gasket extends along the surface of the display interior to the seam so as to provide pressure to clamp the display interior to the seam to apply more force along the display and to provide a clamping force interior to the seam to prevent cleavage modes.

In one or more embodiments, two or more compression gaskets can be employed, with the second compression gasket being disposed against the surface of the display interior to the first compression gasket. The first and second compression gaskets can have different thicknesses such that the exterior compression gasket applies more force against the display to provide the clamping force while the second compression gasket applies less force, thereby serving as a dampener to forces applied normal to the display on a side opposite the compression gaskets. By making the second compression gasket thinner than the first compression gasket, the same material, or materials having the same compression coefficients, can be used for both compression gaskets. Since the first compression gasket is thicker, the preloading applied against the display is greater from this gasket. The lesser force of the second compression gasket can then serve as a vibration dampener for the display when in use.

Turning now to FIG. 1, illustrated therein is one embodiment of an electronic device 100 configured in accordance with one or more embodiments of the disclosure. The explanatory electronic device 100 of FIG. 1 is shown as a smart phone for illustrative purposes. However, it will be obvious to those of ordinary skill in the art having the benefit of this disclosure that other electronic devices may be substituted for the explanatory smart phone of FIG. 1. For example, the electronic device 100 may be configured as a palm-top computer, a tablet computer, a gaming device, wearable computer, a media player, or other device.

A user 113 is holding the electronic device 100. The operating system environment, which is configured as executable code operating on one or more processors or control circuits of the electronic device 100, has associated therewith various applications or "apps." Examples of such applications shown in FIG. 1 include a cellular telephone application 102 for making voice telephone calls, a web browsing application 105 configured to allow the user 113 to view webpages on the display 101 of the electronic device 100, an electronic mail application 106 configured to send and receive electronic mail, a shopping application 107 configured to permit a user to shop for goods and services online, and a camera application 108 configured to capture still (and optionally video) images. These applications are illustrative only, as others will be obvious to one of ordinary skill in the art having the benefit of this disclosure.

The display 101 of the electronic device 100 is configured as an organic light emitting diode display. An organic light emitting diode display is one type of display 101 suitable for use with the invention, and will accordingly be used for explanatory purposes in this disclosure. However, it should be noted that other types of displays, including liquid crystal displays, would be obvious to those of ordinary skill in the art having the benefit of this disclosure.

As will be shown in more detail below, in one embodiment the display 101 comprises two substrate layers having a liquid crystal or organic polymer disposed therebetween. In the case of an organic light emitting diode layer, a film of organic material will be disposed between the two substrate layers. Each substrate layer is coupled to the other by a seam disposed about a periphery of the display 101. The seam serves as a lateral boundary for the liquid crystal, organic polymer, or other material disposed between the substrate layers. The seam both holds the substrate layers together and keeps the liquid crystal, organic polymer, or other material disposed between the substrate layers from escaping.

Figure 2:
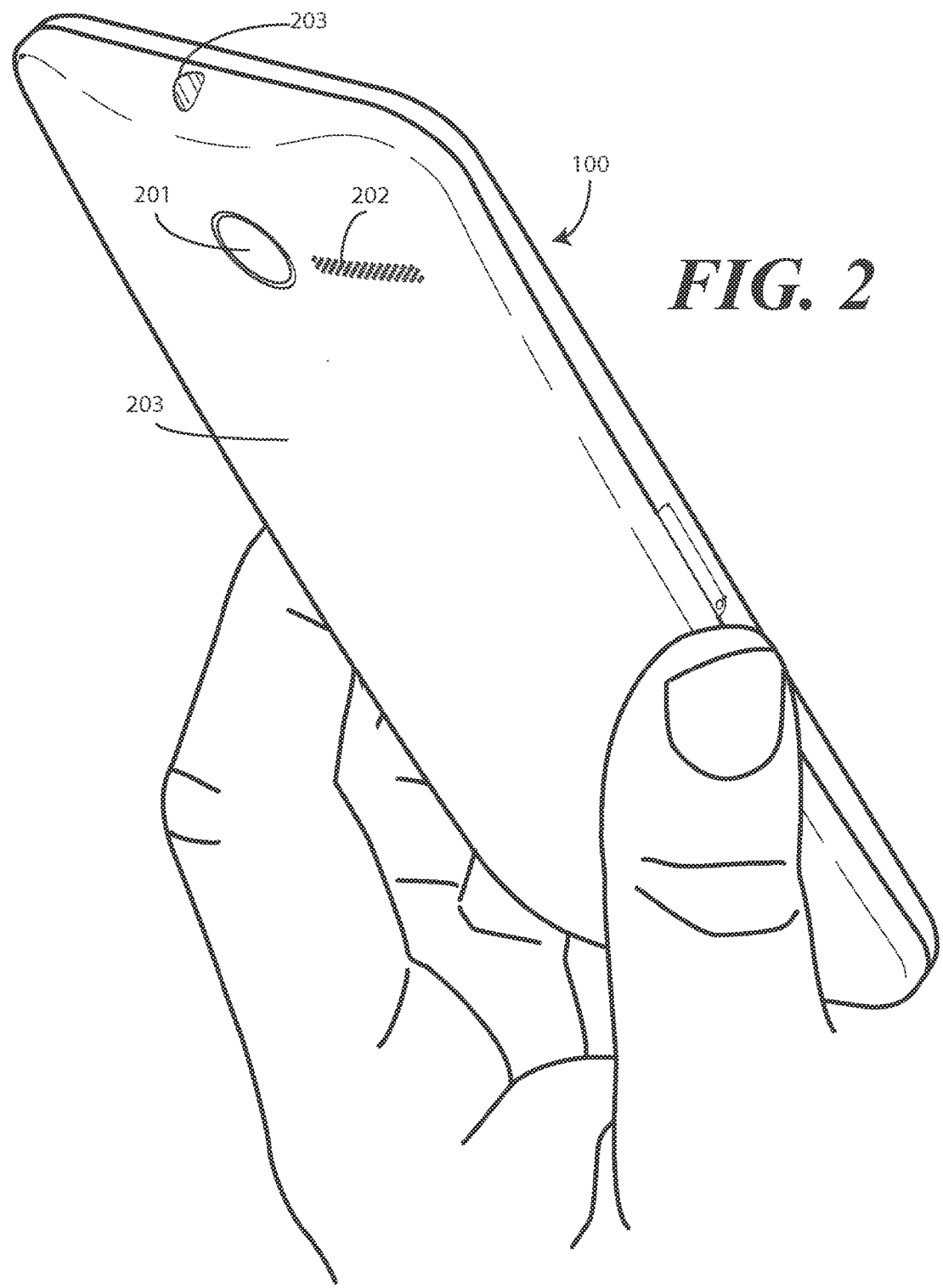

The explanatory electronic device 100 of FIG. 1 includes two housing members. An upper housing member 103 is disposed about the periphery of the display 101. As shown in FIG. 2, a lower housing member 203 forms the backside of the electronic device 100 in this illustrative embodiment. Features can be incorporated into the housing members, including the buttons 109,110,111,112 disposed along the upper housing member 103 shown in FIG. 1, or the camera 201, speaker port 202, or audio jack 204 shown in FIG. 2.

Turning now to FIG. 2, illustrated therein is the electronic device (100) shown as a schematic block diagram 300. The schematic block diagram 300 illustrates one embodiment of internal circuitry, software modules, firmware modules, and other components in that can be included in an explanatory electronic device (100) configured in accordance with embodiments of the disclosure. While this illustrative internal circuitry is directed to a generic electronic device, note that it could be readily adapted to any number of specific devices.

As shown in the schematic block diagram 300, a control circuit 301 is operable with the display 101, which is configured with touch-sensitive capabilities in this illustrative embodiment. The control circuit 301, which may be a microprocessor, programmable logic, application specific integrated circuit device, or other similar device, is capable of executing program instructions. The program instructions may be stored either in the control circuit 301 or in a memory 302 or other computer readable medium operable with the control circuit 301. The memory 302 can also store executable code corresponding to the various applications 303 that are operable on the electronic device (100), such as those described above with reference to FIG. 1.

The control circuit 301 is configured, in one embodiment, to operate the various functions of the electronic device (100). The control circuit 301 can execute software or firmware applications stored in memory 302 to provide device functionality. In one embodiment, the control circuit 301 is configured to be operable with a display driver 306 to effect and control presentation of information on the display 101.

Coupled to, and operable with, the controller is the display 101. The explanatory display 101 of FIG. 1 is shown as a plurality of layers. While this illustrates one embodiment of a touch sensitive display, it will be clear to those of ordinary skill in the art having the benefit of this disclosure that embodiments of the disclosure are not so limited. Numerous other display configurations, be they touch sensitive or not, can be substituted without departing from the spirit and scope of the disclosure.

Figure 3:
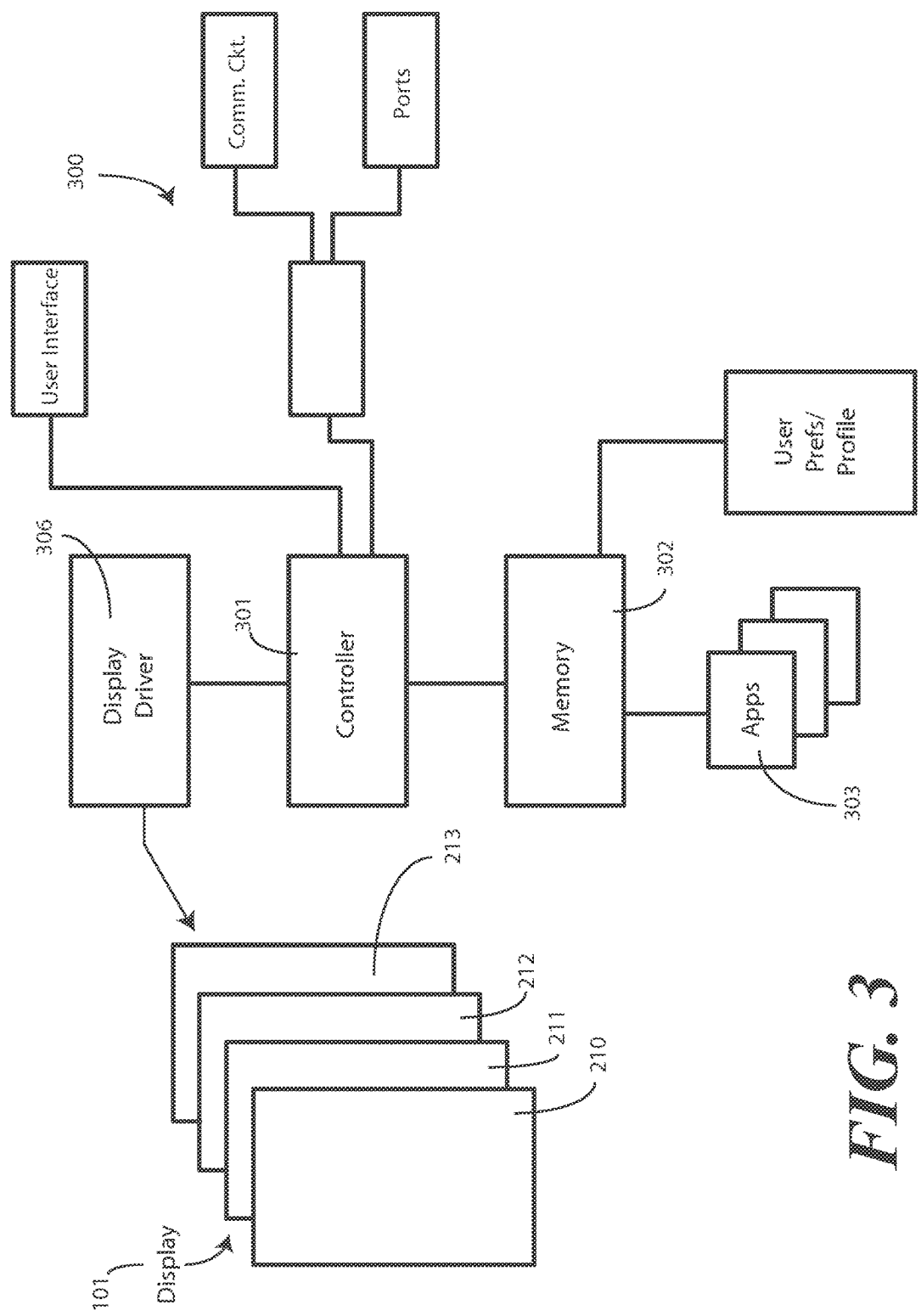
FIG. 3 illustrates a schematic block diagram of an explanatory electronic device configured in accordance with one or more embodiments of the disclosure.

In the illustrative embodiment of FIG. 3, the four layers of the display 101 are shown, although other optional layers could be included as needed. Starting from the top, a fascia layer 210 is provided. The fascia layer 210 may be manufactured from glass or a thin film sheet. As used herein, a "fascia" is a covering or housing, which may or may not be detachable. Suitable materials for manufacturing the cover layer include clear or translucent plastic film, glass, plastic, or reinforced glass. Reinforced glass can comprise glass strengthened by a process such as a chemical or heat treatment. The fascia layer 210 may also include a ultraviolet barrier. Such a barrier is useful both in improving the visibility of display 101 and in protecting internal components of the electronic device.

Beneath the fascia layer 210 is the capacitive touch sensor layer 211. The capacitive touch sensor layer 211 is included to provide the touch sensing function. The capacitive touch sensor layer 211, which can be constructed by depositing small capacitive plate electrodes on a transparent substrate, is configured to detect the presence of an object, such as a user's finger or stylus, near to or touching the display 101. Circuitry operable with or disposed within the control circuit 301 is configured to detect a change in the capacitance of a particular plate combination on the capacitive touch sensor layer 211. The capacitive touch sensor layer 211 may be used in a general mode, for instance to detect the general proximate position of an object relative to the touch sensitive display. The capacitive touch sensor layer 211 may also be used in a specific mode, where a particular capacitor plate pair may be detected to detect the precise location of an object along length and width of the touch sensitive display. Note that the capacitive touch sensor layer 211 is a particular implementation of an electromagnetic field sensor, and other types of electromagnetic field sensors, such as a magnetic field sensor, can replace the capacitive field sensor.

Note that while the capacitive touch sensor layer 211 and the fascia layer 210 are shown as separate layers in FIG. 2 for illustrative purposes, in many embodiments they will be integrated into a single element to achieve a thinner overall form factor of the electronic device (100). Accordingly, in one embodiment the capacitive touch sensor layer 211 is integrated with the fascia layer 210 by depositing the capacitor plate electrodes of the capacitive touch sensor layer 211 directly upon the fascia layer 210. For example, indium tin oxide defining the capacitor plate electrodes can be laminated directly to the underside of the fascia layer 210.

Disposed beneath the capacitive touch sensor layer 211 is the display layer 212. The display layer 212 houses the active material that controls the presentation operation of the display 101. For example, where the display layer 212 is an organic light emitting diode layer, the display layer 212 will comprise two substrate layers sealed together at a seam disposed along a periphery of each substrate layer. The substrate layers can have clear control electrodes disposed thereon. For example, the electrodes can be manufactured by depositing indium tin oxide along the substrates. One or more organic thin films are disposed between the substrates and within the seam. When electrical current is applied to the electrodes, the organic films emit light to present information on the display 101.

Were the display layer 212 not an organic light emitting diode layer, but rather another technology such as a liquid crystal layer, additional layers may be required. For example, a backlighting layer may need to be disposed beneath a liquid crystal layer because liquid crystal, unlike organic light emitting diode films, do not produce light.

Beneath the active display layer is an optional reflector 213. The reflector 213 can reflect light generated by the display layer 212 (or a backlighting layer were included) back out of the display 101. The reflector 213 can be manufactured from a reflective material such as polyethylene terephthalate in one embodiment.

Figure 4:
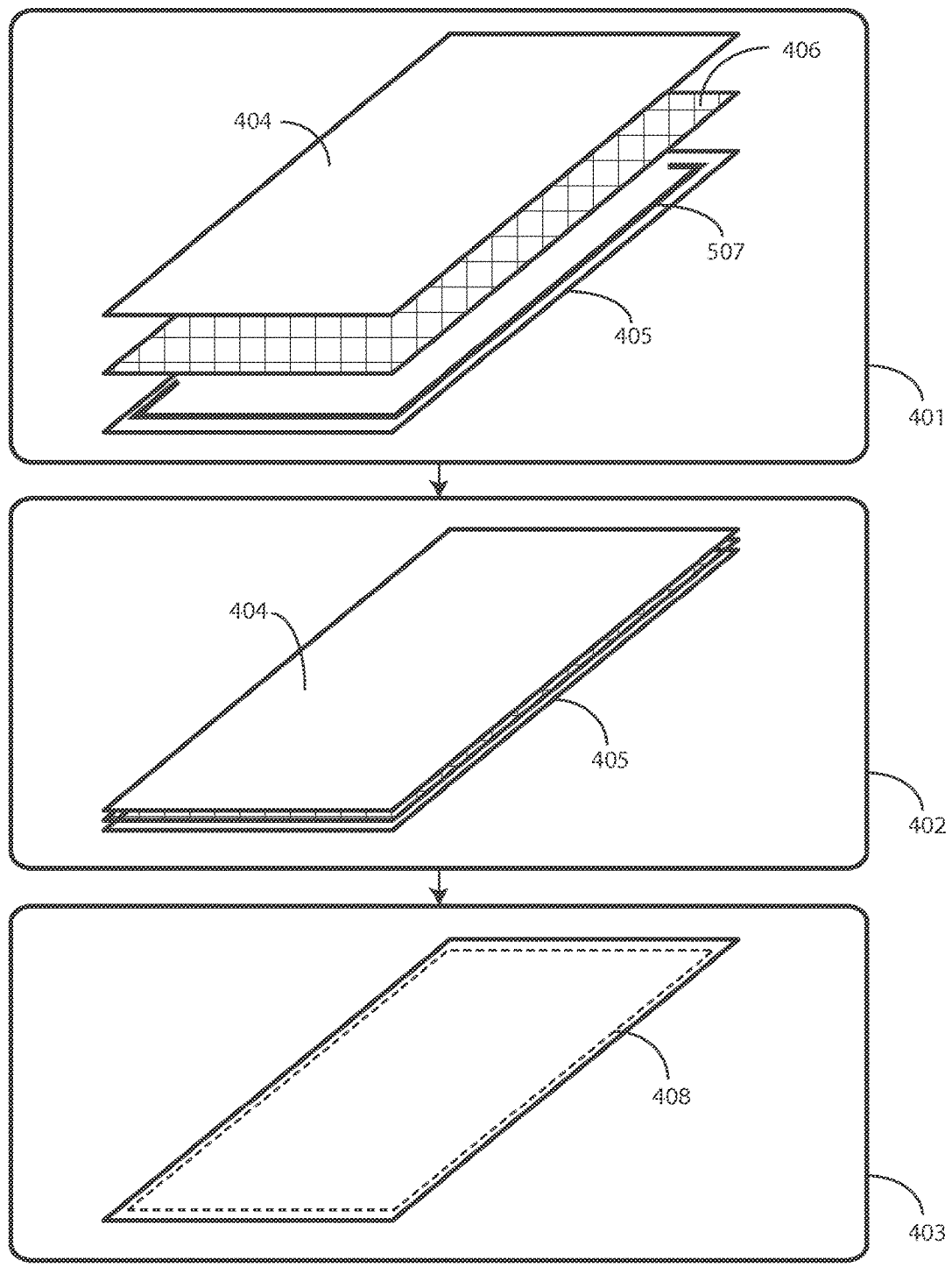
FIG. 4 illustrates a prior art method of manufacturing a display.

As noted above, an organic light emitting diode display will be used in this disclosure for explanatory purposes. Turning now to FIG. 4, illustrated is a generalized method of how such a display is manufactured to better explain the seam associated with such displays.

As shown at step 401, two layers or three layers of organic material 406 are disposed between two substrate layers 404,405. A coupler 407 is then deposited, coated, or formed exterior to the organic material 406. In the case of organic light emitting diode displays, the coupler 407 is generally fit. Frit refers to a ceramic composition that can be thermally fused or quenched to form a glass. As used with organic light emitting diode display technology, the frit is generally a powdered glass or solid glass hardened by a laser. However, frit can also refer to a gel glass to which an organic material is added, or other variants.

At step 402, the substrate layers 404,405 are pressed together and a thermal source is applied to the frit. In one embodiment, a laser radiator directs a laser to the coupler 407 to harden the frit and seal two substrate layers 404,405 together. The seam 408 formed by the fused frit is shown at step 403.

Figure 5:
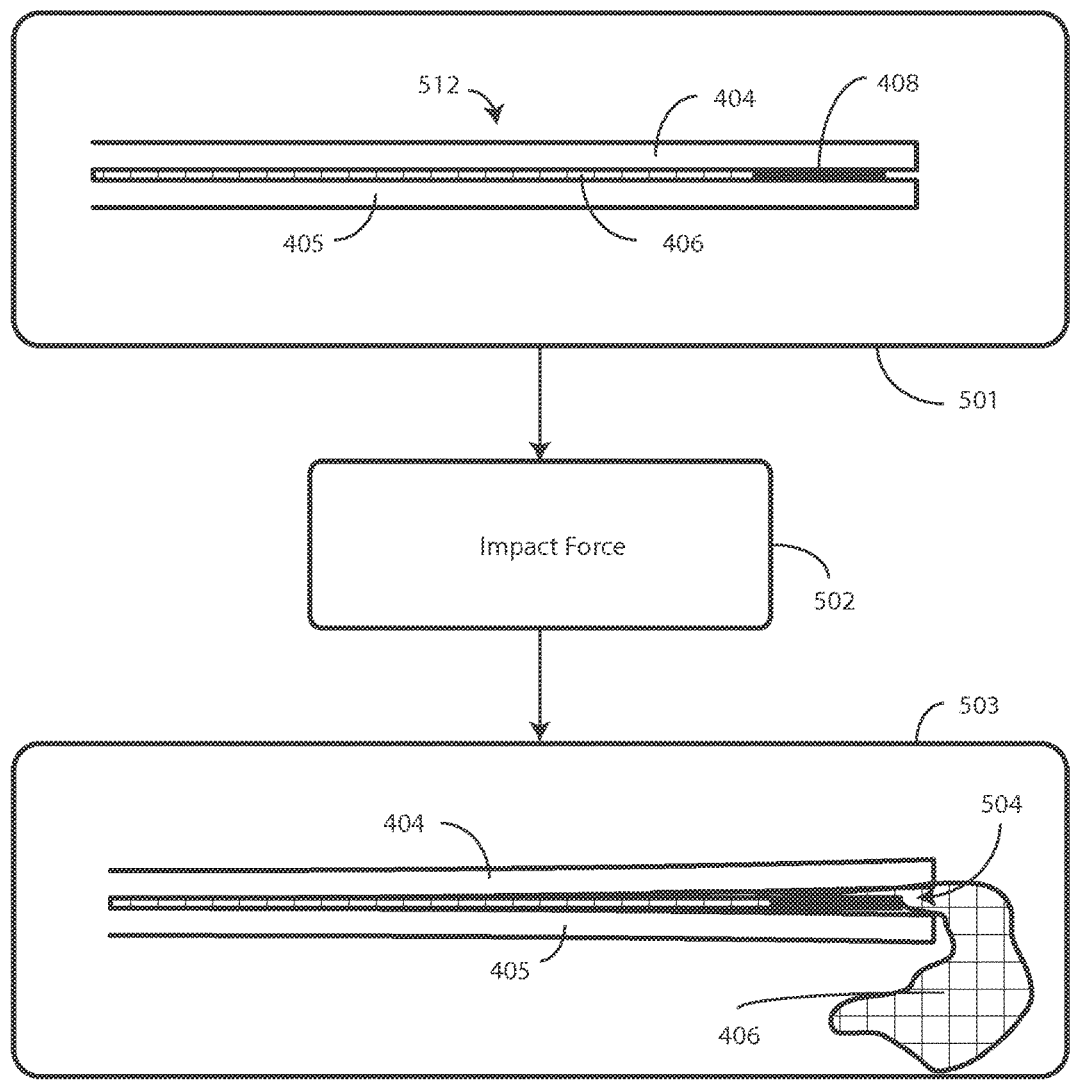
FIG. 5 illustrates damage that can occur to a prior art display.

FIG. 5 illustrates some of the problems with frit seams that have been identified by experimental testing. At step 501, an display layer 512 having a first substrate layer 404, a second substrate 405, and an organic material 406 disposed therebetween. The seam 408 formed by fused fit retains the organic material 406 between the substrate layers 404,405.

At step 502, an impact force is applied to the display layer 512. As shown at step 503, this causes the seam 408 formed by the frit to fail, resulting in a cleavage mode 504 occurring between the substrate layers 404,405. The cleavage mode 504 separates the substrate layers 404,405, thereby allowing the organic material 406 to escape. This renders the display layer 512 inoperable.

Embodiments of the present disclosure provide a clamping force that works to prevent the cleavage mode by placing a compression gasket between housing member and the display. The compression gasket presses against a surface of the display interior to the seam. Thus, when looking at the display in plan view, the seam circumscribes the compression gasket in one embodiment. In another embodiment, the compression gasket initially coincides with the exterior edge of the seam, but extends interior to the seam along a surface of the display. As used herein, "interior" is used in the predicate adjective form, and means situated within or inside; relating to the inside; inner. In the predicate sense, this means interior to, or chiefly technical situated further in or within. The compression gasket applies a preloading force to the display interior to the seam. Accordingly, when force is applied, both the seam and the compression gasket are present to prevent cleavage modes.

Figure 6:
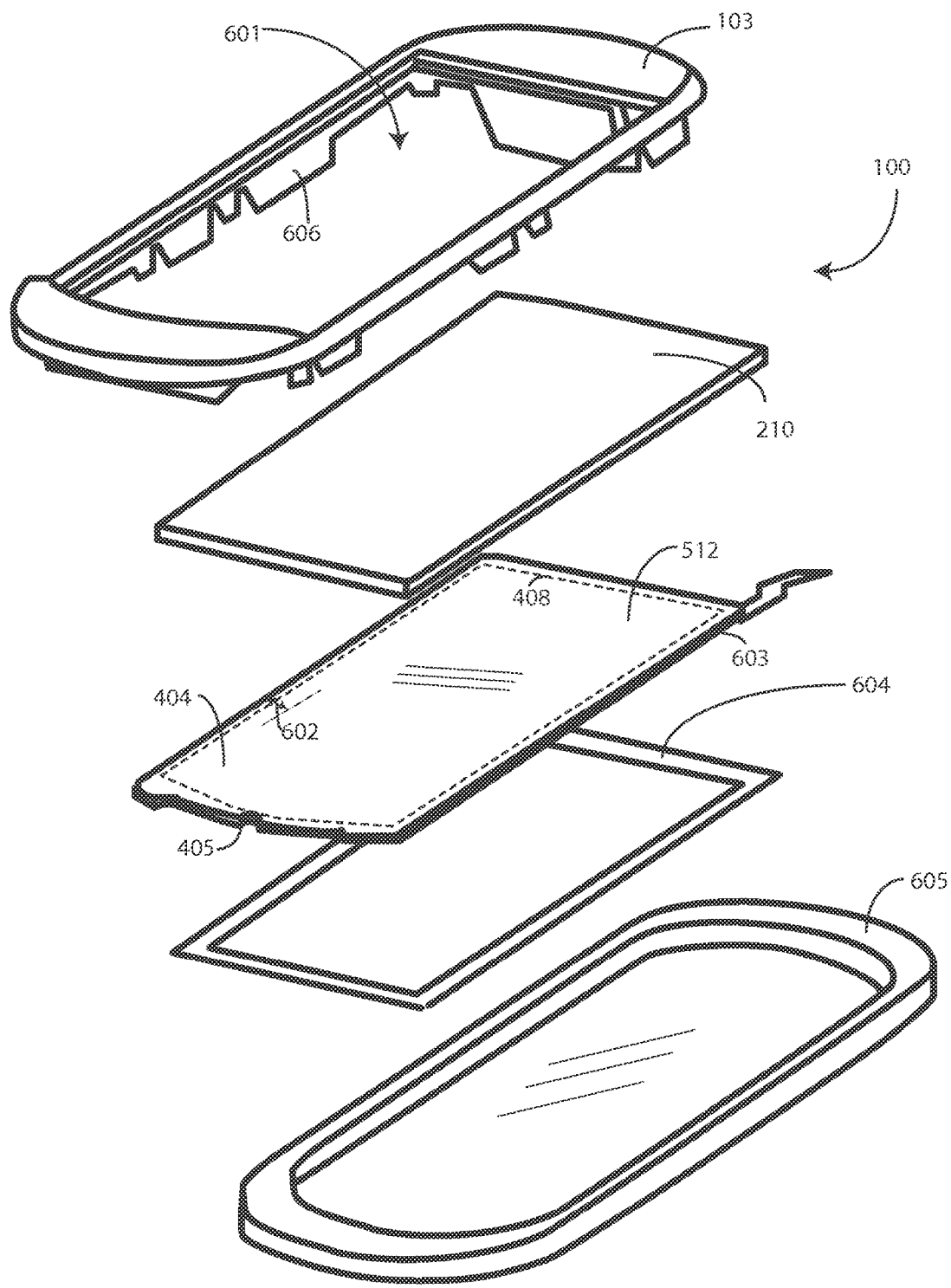
FIG. 6 illustrates an exploded view of an explanatory electronic device configured in accordance with one or more embodiments of the disclosure.

Turning now to FIG. 6, illustrated therein is an exploded view of one explanatory electronic device 100 configured in accordance with one or more embodiments of the disclosure. A first housing member 103 is shown above a fascia layer 210. The first housing member 103 defines an aperture 601. The fascia layer 210 fits within the first housing member 103 to span and cover the aperture 601. Some designers refer to the fascia layer 210 as a "lens," although the fascia layer 210 generally does not include optical magnification properties.

An display layer 512 is disposed beneath the fascia layer 210. The illustrative display layer 512 of FIG. 6 includes two substrate layers 404,405 sealed together at a seam 408 disposed along a periphery 602 of each substrate layer 404,405. As used herein, "periphery" refers to an outer region of an area or object, or in this case, an outer region disposed just within a perimeter 603 of the substrate layers 404,405. For example, if the substrate layers 404,405 are three inches by two inches, the periphery may include portions of the substrate layers 404,405 that extend inward from the perimeter 603 two or three tenths of an inch or so.

Figure 7:
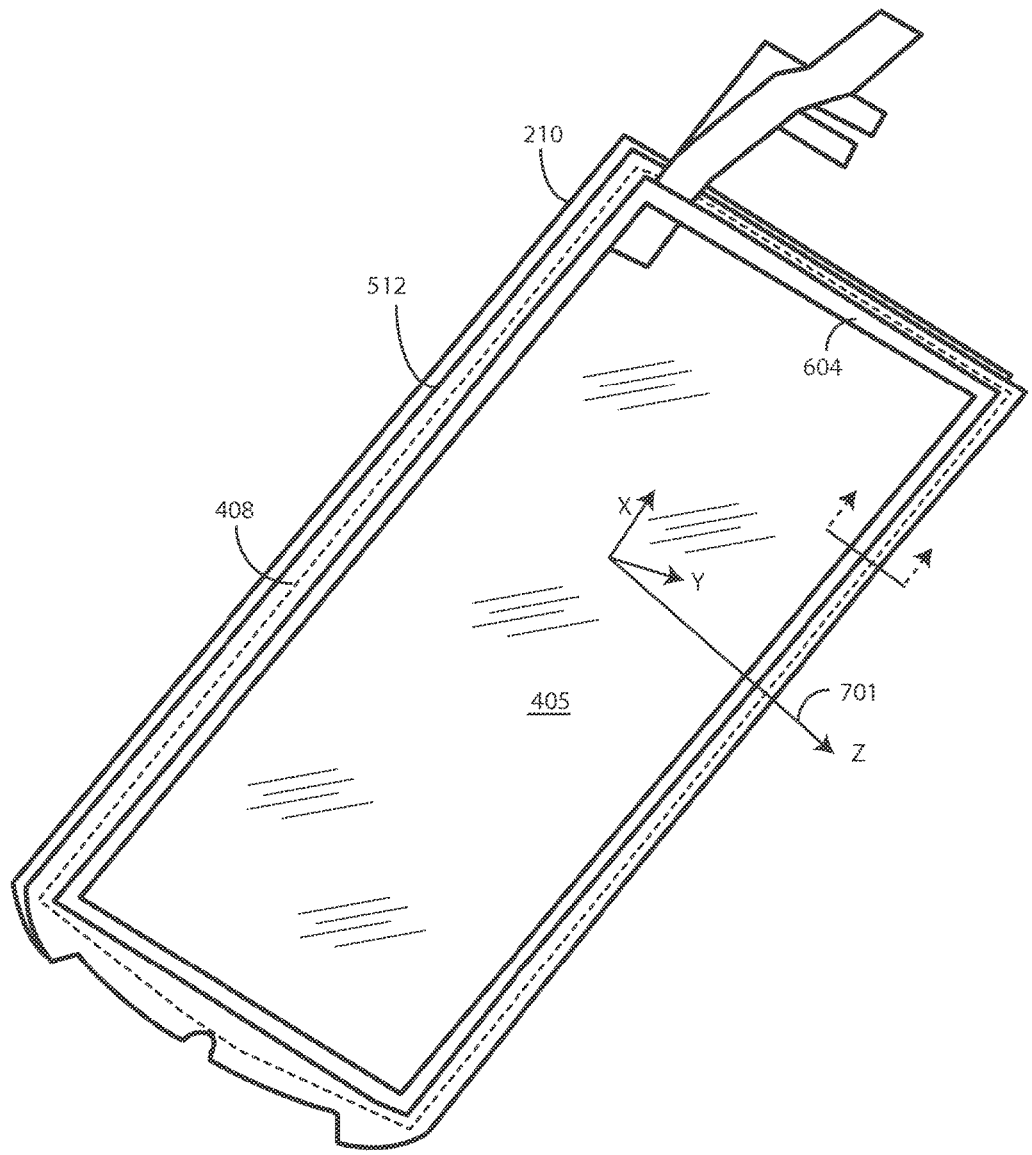
FIG. 7 illustrates an explanatory partially assembled electronic device configured in accordance with one or more embodiments of the disclosure.

A compression gasket 604 is then disposed between a second housing member 605 and the display layer 512. The compression gasket 604 seats against the second substrate layer 405 interior to the seam 408. This is easily seen in FIG. 7 when the fascia layer 210, the display layer 512, and the compression gasket 604 are placed together. The compression gasket 604 is interior to the seam 408. This can be seen as the seam 408 circumscribes the compression gasket 604 when viewed in plan view. Note that plan view is referenced because the compression gasket 604 presses against the second substrate layer 405 while the seam 408 is disposed between the substrate layers (404),405. Accordingly, when viewed along the z-axis 701, the compression gasket 604 is interior to the seam 408 because the seam 408 circumscribes the compression gasket 604. In the illustrative embodiment of FIG. 7, the compression gasket 604 is disposed interior to the seam 408 by at least two millimeters.

Turning back to FIG. 6, when a coupler 606, shown here as a mechanical feature on the first housing member 103 couples the first housing member 103 and the second housing member 605 together, the compression gasket 604 becomes preloaded against the display layer 512. This preloading, in turn, preloads the display layer 512 against the first housing member 103. This can be more readily seen in FIG. 8.

Figure 8:
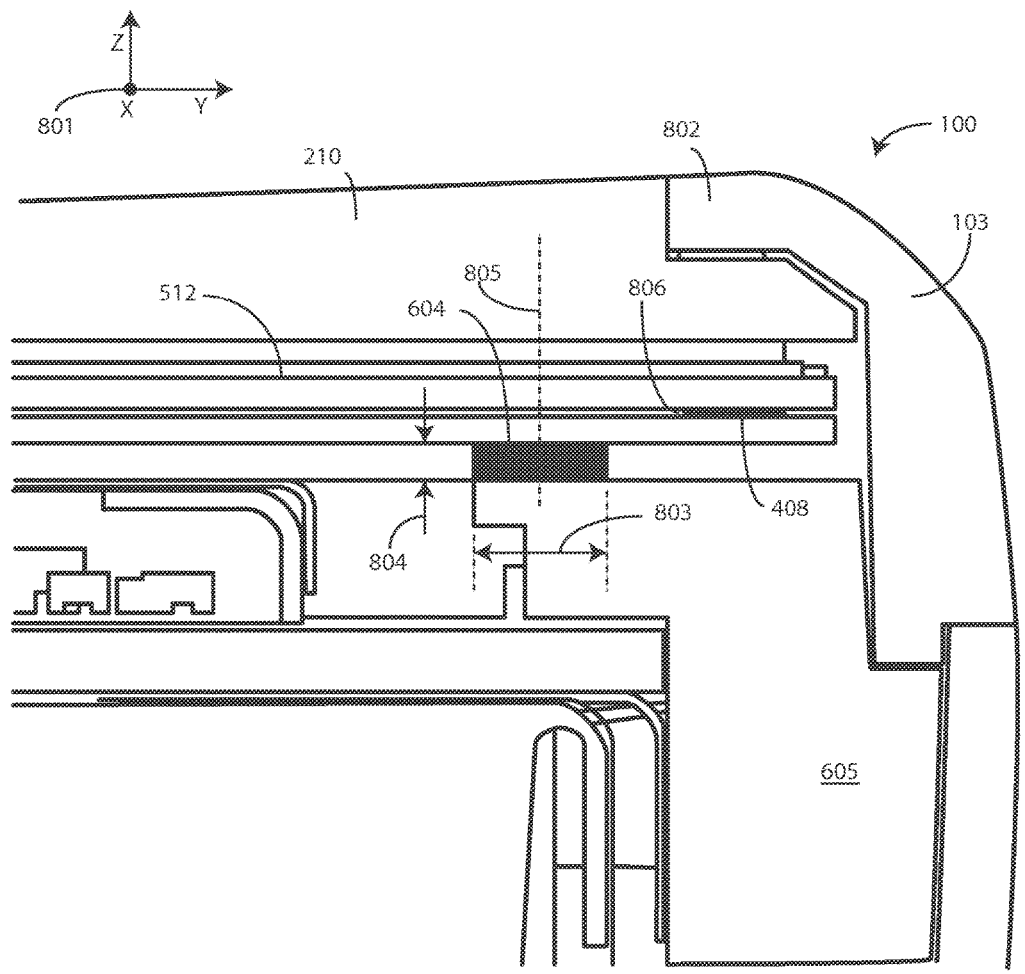
FIG. 8 illustrates an explanatory sectional view of a mechanical stack-up for one illustrative electronic device configured in accordance with one or more embodiments of the disclosure.

Turning now to FIG. 8, illustrated therein is a sectional view showing one explanatory mechanical stack-up for an electronic device 100 configured in accordance with one or more embodiments of the disclosure. As shown in FIG. 8, the first housing member 103 is coupled to the second housing member 605. The fascia layer 210 is disposed between the first housing member 103 and the display layer 512. The compression gasket 604 is disposed against the display layer 512 interior to the seam 408 when viewed along the x-axis 801 in this sectional view. The first housing member 103 has portions 802 is disposed on a side of the display layer 512 that is opposite the compression gasket 604 and the second housing member 605 in this illustrative embodiment.

As shown in FIG. 8, the compression gasket 604 has a width 803 and a thickness 804. In one embodiment, the width 803 of the compression gasket 604 is between about five and about six millimeters. As used herein, the terms "about" or "substantially" refer to dimensions inclusive of manufacturing tolerances. Thus, if the manufacturing tolerances were plus or minus 3/10ths of a millimeter, both 4.98 millimeters and 5.012 millimeters would be "about" five millimeters. In one embodiment, the thickness 804 of the compression gasket 604 is between about one and about two millimeters.

In this illustrative embodiment, a center reference line 805 of the compression gasket 604 is about three millimeters interior to the interior edge 806 of the seam 408. While other distances can be used without departing from the spirit and scope of the present disclosure, experimental testing has shown that this distance is sufficient to gain the necessary leverage to clamp the seam 408 to prevent cleavage modes, while not being so large as to allow the distance to become less effective at preventing cleavage modes. Other distances will be obvious to those of ordinary skill in the art having the benefit of this disclosure.

Figure 9:
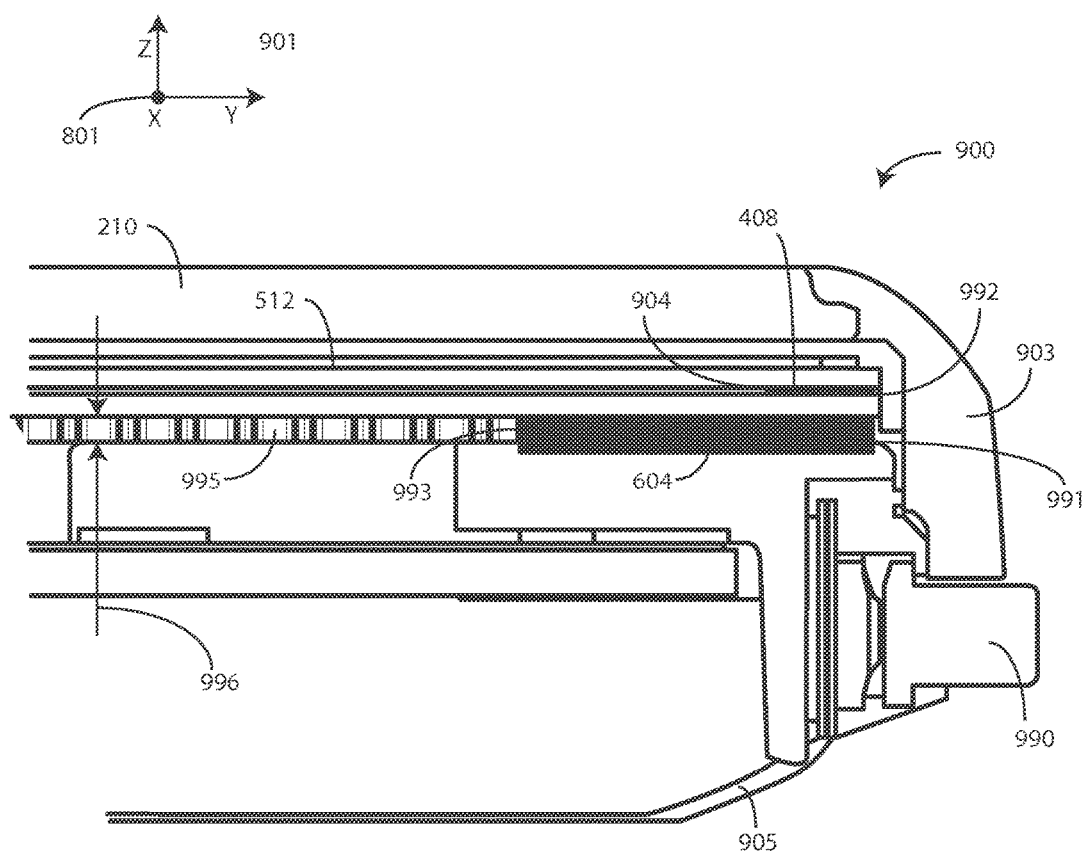
FIG. 9 illustrates another explanatory sectional view of a mechanical stack-up for one illustrative electronic device configured in accordance with one or more embodiments of the disclosure.

Turning now to FIG. 9, illustrated therein is another sectional view showing another explanatory mechanical stack-up for another electronic device 900 configured in accordance with one or more embodiments of the disclosure. While the housing members of FIG. 8 sealed "top to bottom," i.e., along the z-axis (701), in the embodiment of FIG. 9 is sealed "side to side," i.e., along the y-axis 901. Moreover, a sealing pin 990 is being used to couple the upper housing member 903 to the lower housing member 905.

As with the embodiment of FIG. 8, the fascia layer 210 is disposed between the first housing member 903 and the display layer 512. A compression gasket 604 is disposed against the display layer 512. In this embodiment, rather than being disposed completely interior to the seam 408, the compression gasket 604 extends along a surface of the display layer 512 from the periphery (602) interior to the seam 408. Said differently, an exterior edge 991 of the compression gasket 604 is aligned along the y-axis 901 with an exterior edge 992 of the seam 408. (Note that the exterior edge 991 of the compression gasket 604 can extend exterior along the y-axis 901 to the exterior edge 992 of the seam 408 in other embodiments.) However, the compression gasket 604 extends along the surface of the display layer 512 interior to the seam 408 when viewed along the x-axis 801 in this sectional view by having its interior edge 993 extend interior to an interior edge 994 of the seam 408. In one embodiment, the interior edge 993 extend interior to an interior edge 994 of the seam 408 by at least two millimeters.

Another difference shown in FIG. 9 is the inclusion of a second compression gasket 995.

In this illustrative embodiment, the second compression gasket 995 is disposed interior to the compression gasket 604. Additionally, the thickness 996 of the second compression gasket 995 is less than the thickness (804) of the compression gasket 604. In one embodiment, making the second compression gasket 995 less thick than the compression gasket 604 is intentional. Where the compression gasket 604 and the second compression gasket 995 are made from the same material or have the same compression coefficient, making the second compression gasket 995 thinner results in the second compression gasket 995 applying less force to the display layer 512 than the compression gasket 604. Said differently, the second compression gasket 995 preloads the display 512 against the first housing member 903 less than does the compression gasket 604.

This allows the compression gasket 604 to work to prevent cleavage modes in the display layer 512. The second compression gasket 995, being thinner, can then work as a dampener to dampen vibration applied to the fascia layer 210 or the display layer 512 when the electronic device 900 is in use. In one embodiment, the second compression gasket 995 is half as thick as the compression gasket 604. Moreover, as seen in FIG. 9, in this illustrative embodiment the second compression gasket 995 is wider than the compression gasket 604 as well.

Figure 10:
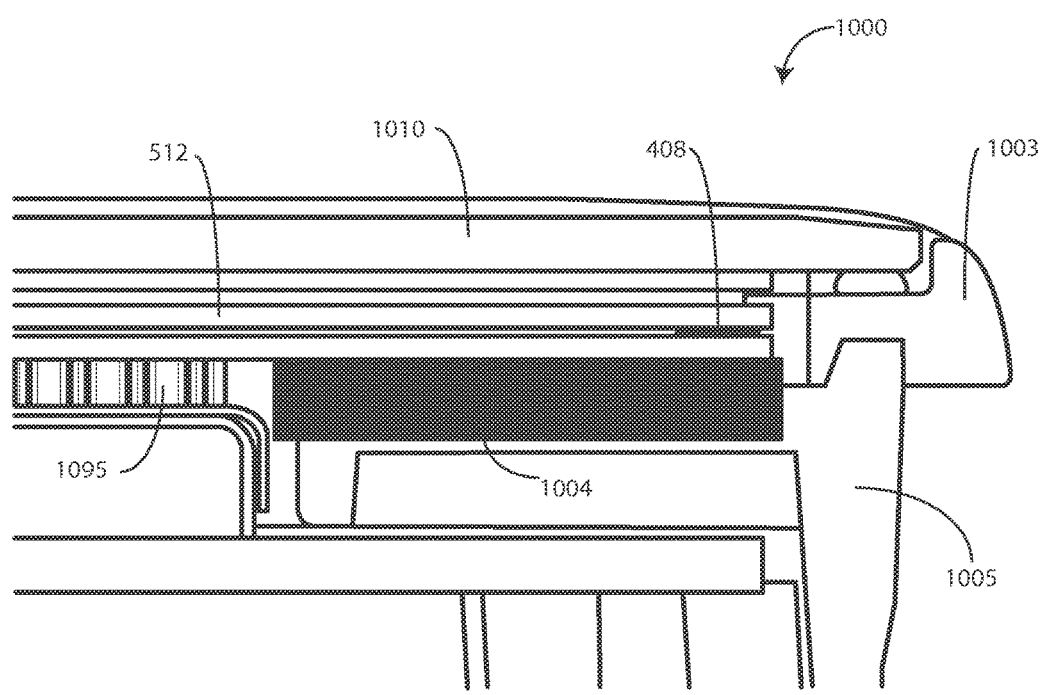
FIG. 10 illustrates another explanatory sectional view of a mechanical stack-up for one illustrative electronic device configured in accordance with one or more embodiments of the disclosure.

Turning now to FIG. 10, illustrated therein is yet another sectional view showing another explanatory mechanical stack-up for another electronic device 1000 configured in accordance with one or more embodiments of the disclosure. While the fascia layers (210) of FIGS. 8 and 9 were disposed between the housing members (103,903) and the display layer 512, in this illustrative embodiment the fascia layer 1010 sits atop the upper housing element 1003. As with previous embodiments, the upper housing element 1003 to the lower housing element 1005 are coupled together.

As with the previous embodiments, a compression gasket 1004 is disposed against the display layer 512. The compression gasket 1004 is biased against a surface of the display layer 512 at portions of the display layer 512 that are interior to the seam 408 by the first housing element 1003 and the second housing element 1005. This causes the compression gasket 1004 to preload the display layer 512 against the upper housing element 1003. As with the embodiment of FIG. 9, rather than being disposed completely interior to the seam 408, the compression gasket 1004 extends along a surface of the display layer 512 from the periphery (602) interior to the seam 408. Accordingly, the compression gasket 1004 is further biased against the surface of the display layer 512 beneath the seam 408 in this illustrative embodiment.

Also as with the embodiment of FIG. 9, the embodiment of FIG. 10 includes a second compression gasket 1095 disposed interior to the compression gasket 1004. The thickness of the second compression gasket 1095 is less than the thickness of the compression gasket 1004. The second compression gasket 1095 is wider than the compression gasket 604 as well.

Figure 11:
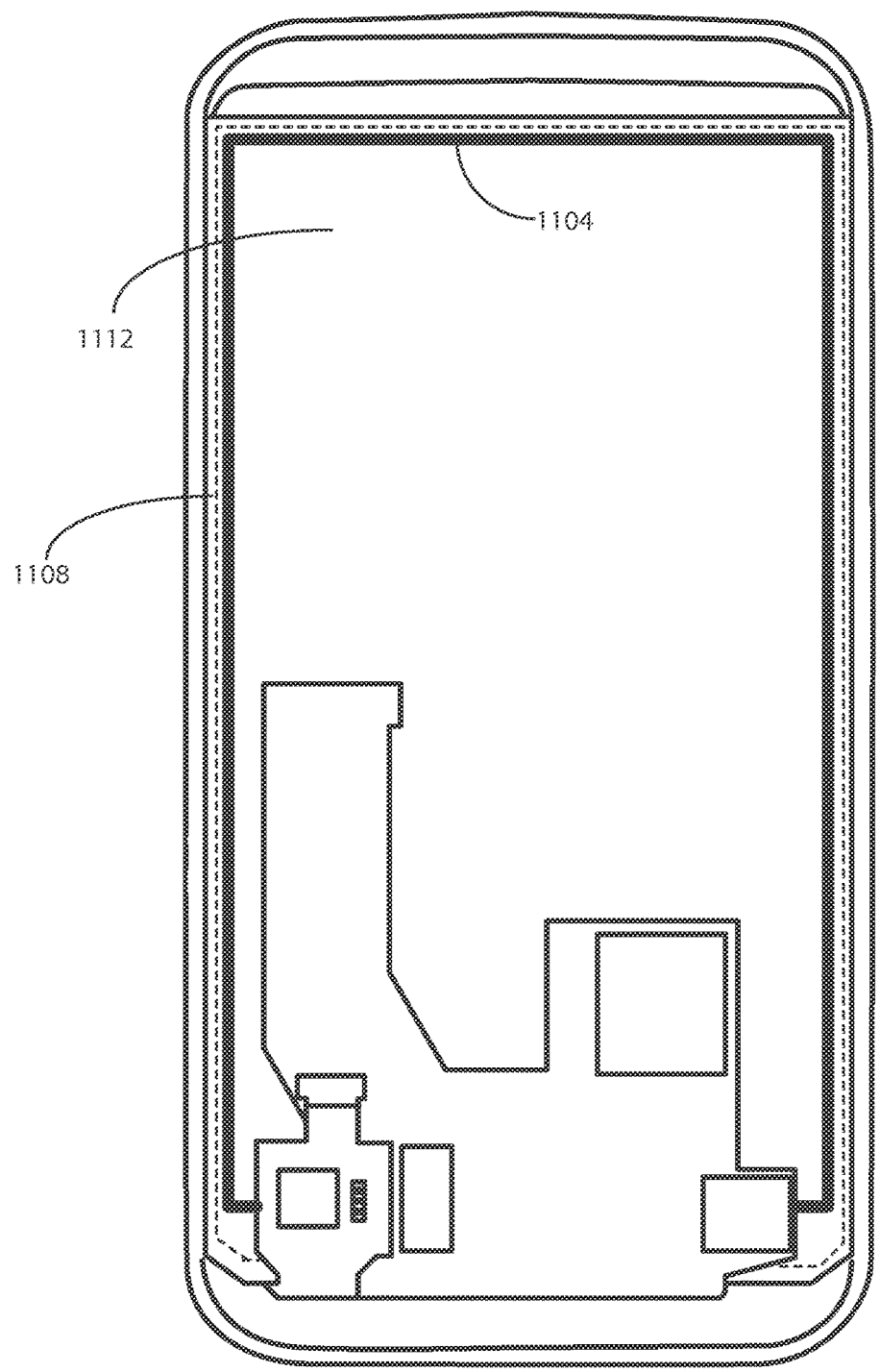
FIG. 11 illustrates a rear view of a partially assembled electronic device configured in accordance with one or more embodiments of the disclosure.
Figure 12:
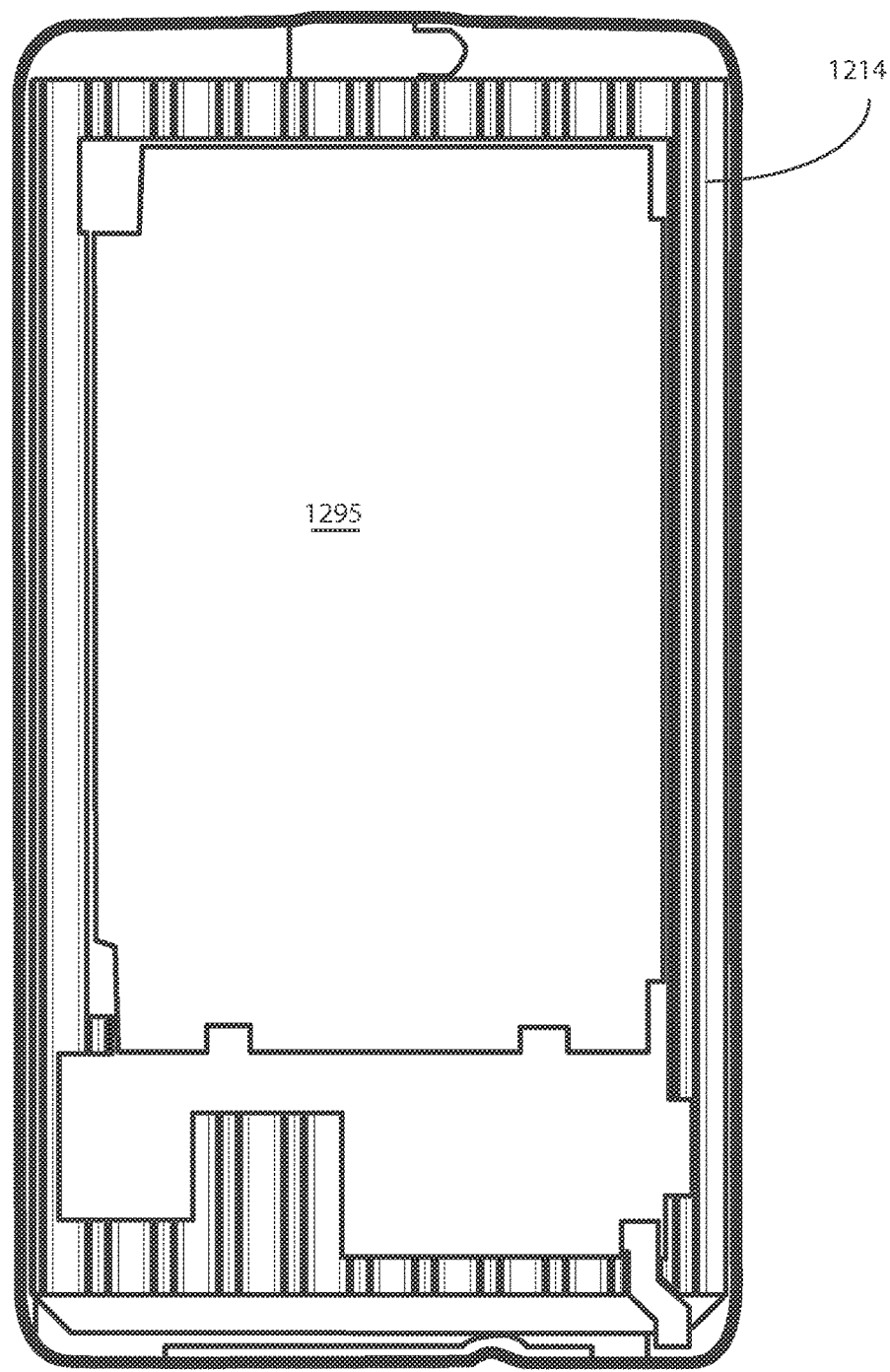
FIG. 12 illustrates another rear view of a partially assembled electronic device configured in accordance with one or more embodiments of the disclosure.

Turning now to FIGS. 11 and 12, illustrated therein are plan views showing a first explanatory mechanical stack-up in FIG. 11 and another in FIG. 12. In FIG. 11, the stack up includes only a single compression gasket 1104. The single compression gasket 1104 is disposed completely interior to the seam 1108 of the display 1112 in this embodiment. In this embodiment, the seam 1108 comprises a fused weld between glass substrates.

By contrast, in FIG. 12, both a first compression gasket 1204 and a second compression gasket 1295 are used. The second compression gasket 1295 is interior to the first compression gasket 1204 and fills all areas interior to the first compression gasket 1204. The second compression gasket 1295 of this illustrative embodiment is further biased against the surface of the display beneath the seam (not visible in this plan view). The second compression gasket 1295 is thinner and wider than the first compression gasket 1204 as well.

As described above, a specifically placed compression gasket can be used to maximize load just inside a seam, which is fit in one or more display types, for the purposes of clamping to prevent cleavage modes. By using a compression gasket rather than a compression pad that spans the entire display, the clamping force is applied when the compression gasket preloads the display against the fascia layer or housing member. The periphery compression gasket placement focuses the maximum force to clamp the display substrate layers together without overloading the remainder of the device assembly.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a housing member;
   a display comprising two substrate layers sealed together at a seam disposed along a periphery of each substrate layer;
   a first compression gasket disposed between the housing member and the display, the first compression gasket being disposed against the display interior to the seam; and
   a second compression gasket disposed against the display and interior to the first compression gasket, the second compression gasket being thinner than the first compression gasket, the first compression gasket lying in a plane parallel to the display and the second compression gasket also lying in the plane parallel to the display, and a majority of the second compression gasket lying in the same plane as the first compression gasket.

2. The electronic device of claim 1, further comprising a second housing member disposed opposite the display from the first compression gasket and the housing member.

3. The electronic device of claim 2, the housing member and the second housing member coupled together to preload the first compression gasket against the display.

4. The electronic device of claim 3, further comprising a fascia layer disposed between the second housing member and the display.

5. The electronic device of claim 1, the first compression gasket disposed interior to the seam by at least two millimeters.

6. The electronic device of claim 1, the first compression gasket having a width of between about five and about six millimeters.

7. The electronic device of claim 1, the second compression gasket half as thick as the first compression gasket.

8. The electronic device of claim 1, the second compression gasket wider than the first compression gasket in a direction parallel with the display.

9. The electronic device of claim 1, the display comprising an organic light emitting display.

10. The electronic device of claim 9, the seam comprising a fused frit seam.

11. The electronic device of claim 2, the housing member and the second housing member coupled together such that the second compression gasket preloads the display against the housing member at a force less than that of the first compression gasket.

12. An electronic device, comprising:
   a housing member;
   a display comprising two substrate layers sealed by a seam along a periphery of the display;
   a first compression gasket disposed between the housing member and the display, the first compression gasket extending along a surface of the display from the periphery interior to the seam; and
   a second compression gasket disposed against the display and interior to the first compression gasket, the second compression gasket being thinner than the first compression gasket, the first compression gasket lying in a plane parallel to the display and the second compression gasket also lying in the plane parallel to the display, and a majority of the second compression gasket lying in the same plane as the first compression gasket.

13. The electronic device of claim 12, the first compression gasket extending at least two millimeters interior to the seam.

14. The electronic device of claim 12, wherein the second compression gasket is wider than the first compression gasket in a direction parallel with the display.

15. The electronic device of claim 12, the seam comprising a fused weld.

16. The electronic device of claim 12, further comprising a second housing member disposed opposite the display from the first compression gasket and the housing member, the housing member and the second housing member coupled together to preload the first compression gasket against the display.

17. The electronic device of claim 16, the housing member and the second housing member coupled together such that the second compression gasket preloads the display against the housing member at a force less than that of the first compression gasket.

18. An electronic device, comprising:
a first housing element and a second housing element;
a display comprising two substrates joined by a seam formed at a periphery of the display;
a first compression gasket biased against a surface of the display interior to the seam by the first housing element to preload the display against the second housing element; and
a second compression gasket disposed against the display and interior to the first compression gasket, the second compression gasket being thinner than the first compression gasket, the first compression gasket lying in a plane parallel to the display and the second compression gasket also lying in the plane parallel to the display, and a majority of the second compression gasket lying in the same plane as the first compression gasket.

19. The electronic device of claim 18, the first compression gasket further biased against the surface of the display beneath the seam.

20. The electronic device of claim 18, wherein the second compression gasket preloads the display against the second housing element at a force less than that of the first compression gasket.

* * * * *